(12) United States Patent
Sakoda et al.

(10) Patent No.: US 7,893,508 B2
(45) Date of Patent: Feb. 22, 2011

(54) SEMICONDUCTOR DEVICE AND MANUFACTURING METHOD THEREOF

(75) Inventors: Tsunehisa Sakoda, Kawasaki (JP); Kazuto Ikeda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/518,317

(22) Filed: Sep. 11, 2006

(65) Prior Publication Data

US 2007/0232004 A1 Oct. 4, 2007

(30) Foreign Application Priority Data

Mar. 30, 2006 (JP) .............................. 2006-093276

(51) Int. Cl.
*H01L 29/94* (2006.01)
(52) U.S. Cl. ...................... 257/410; 257/405; 257/406; 257/411; 257/E21.625; 257/E21.639
(58) Field of Classification Search ......... 257/410–411, 257/E21.625, E21.639
See application file for complete search history.

(56) References Cited

U.S. PATENT DOCUMENTS

2006/0131672 A1* 6/2006 Wang et al. ................. 257/410
2007/0096226 A1* 5/2007 Liu et al. ..................... 257/411

FOREIGN PATENT DOCUMENTS

JP 2004-288885 * 10/2004
JP 2006-19615 A 1/2006

* cited by examiner

*Primary Examiner*—Cuong Q Nguyen
*Assistant Examiner*—Trang Q Tran
(74) *Attorney, Agent, or Firm*—Fujitsu Patent Center

(57) ABSTRACT

A semiconductor device capable of suppressing a threshold shift and a manufacturing method of the semiconductor device. On a high dielectric constant insulating film, a diffusion barrier film for preventing the diffusion of metal elements from the high dielectric constant insulating film to an upper layer is formed. Therefore, the diffusion of the metal elements from the high dielectric constant insulating film to the upper layer can be prevented. As a result, a reaction and bonding between the metal elements and a Si element in a gate electrode can be suppressed near a boundary between an insulating film and the gate electrode.

3 Claims, 12 Drawing Sheets

SEMICONDUCTOR DEVICE AND MANUFACTURING METHOD THEREOF

CROSS-REFERENCE TO RELATED APPLICATIONS

This application is based upon and claims the benefits of priority from the prior Japanese Patent Application No. 2006-093276, filed on Mar. 30, 2006, the entire contents of which are incorporated herein by reference.

BACKGROUND OF THE INVENTION

1. Field of the Invention

The present invention relates to a semiconductor device and a method for manufacturing the semiconductor device. More particularly, the present invention relates to a semiconductor device having a high dielectric constant insulating film in a gate section. The invention also pertains to a method for manufacturing the semiconductor device.

2. Description of the Related Art

A Metal-Oxide Semiconductor Field Effect Transistor (MOSFET) is known as one of elements used in a semiconductor integrated circuit device. FIGS. 10A and 10B are schematic views of a MOSFET. In the MOSFET, sizes in the longitudinal and lateral directions thereof are simultaneously reduced as shown in the transition from FIG. 10A to FIG. 10B in accordance with a scaling law, as well as the performance is improved while maintaining normal characteristics of the element.

However, accompanying miniaturization of the MOSFET, the following problem occurs. That is, as shown in the transition from a gate insulating film 21 (FIG. 10A) to a gate insulating film 21a (FIG. 10B), when a thickness of a gate insulating film is reduced to about 2 nm equivalent to several atomic layers, a current flows through the gate insulating film, that is, a tunneling current $I_t$ begins to flow. As a result, a leakage current increases uncontrollably. Further, the leakage of a drain current as well as increase in power consumption occurs (see, e.g., Japanese Unexamined Patent Publication No. 2006-019615).

Particularly, the next-generation MOSFET is required to have the following characteristics. That is, even if further miniaturization is promoted, the threshold can be controlled as well as a leakage current, Equivalent Oxide Thickness (EOT: a value obtained by reducing a physical thickness of a material used for a gate insulating film to a thickness of a silicon oxide ($SiO_2$) film indicating a dielectric capacity equivalent to that indicated by the material) and hysteresis are reduced.

In order to realize the above-described next-generation MOSFET, an application of a material (hereinafter, referred to as a high dielectric constant insulating film) with a dielectric constant higher than that of a conventionally used oxide film is proposed for a gate insulating film. Herein, there is studied a method for improving a dielectric constant by adding nitrogen (N) into an oxide film to increase a nitrogen concentration in an obtained oxynitride film.

However, the oxynitride film has the following problem. That is, when the nitrogen concentration in the oxynitride film is increased, an insulation property increases whereas an electric charge due to defects in the film increases to cause significant deterioration in an operation speed and reliability of the MOSFET. Therefore, a high dielectric constant material such as a hafnium oxide ($HfO_2$) or aluminum oxide ($Al_2O_3$) newly used as an alternate material of the oxynitride film is proposed for a high dielectric constant insulating film.

By employing such a high dielectric constant insulating film, a Capacitance Equivalent Thickness (CET: a value obtained by reducing a dielectric capacity indicated by a material used for a gate insulator to a film thickness of a $SiO_2$ film indicating the dielectric capacity equivalent to that of the material) can be suppressed to such a film thickness that no tunneling current $I_t$ flows, as well as a physical film thickness can be increased. Therefore, generation of the tunneling current $I_t$ in the gate insulating film is suppressed and as a result, the leakage current can be reduced.

However, when using a high dielectric constant material, the following problems occur.

Hereinafter, a description will be made with reference to FIGS. 11 and 12.

FIG. 11 is a schematic cross sectional view of a gate section.

The gate section in FIG. 11 has the following structure. That is, a high dielectric constant insulating film 330 is formed on an oxide film 320 formed on a semiconductor substrate (not shown). Further, an insulating film 340 having a silicon (Si) content larger than that of the high dielectric constant insulating film 330 is formed on the film 330. Further, a gate electrode 350 made of polysilicon is formed on the film 340.

FIG. 12 shows the gate voltage versus drain current characteristics of the MOSFET. In FIG. 12, there is shown the gate voltage versus drain current characteristics of a p-MOSFET and n-MOSFET having in the gate section the high dielectric constant insulating film 330 made of an oxynitride film or a high dielectric constant material. According to FIG. 12, when the high dielectric constant insulating film 330 is made of a high dielectric constant material, the threshold voltage shifts from 0.6 to 0.7 V particularly in the p-MOSFET, as compared with a case where the film 330 is made of an oxynitride film. As a result, the thresholds of the p-MOSFET and the n-MOSFET are different from each other to cause a problem that a CMOS circuit cannot be constituted.

As for the cause of the threshold shift, the following is considered. In a manufacturing process of the MOSFET, a heat treatment is performed after the impurity doping in order to form a source/drain region. On this occasion, a metal element 30 such as hafnium (Hf) in the high dielectric constant insulating film 330 is caused to diffuse by heat energy, as shown in FIG. 11. Near a boundary between the insulating film 340 and the gate electrode 350, the diffusing metal element 30 reacts and bonds with a Si element in the gate electrode 350 to form a dipole as well as to generate an electric field. Thus, the electric field generated near the boundary between the insulating film 340 and the gate electrode 350 causes the shift of the threshold. Consequently, when using a high dielectric constant material, operation of a CMOS circuit becomes impossible.

SUMMARY OF THE INVENTION

In view of the foregoing, it is an object of the present invention to provide a semiconductor device capable of suppressing a threshold shift.

Another object of the present invention is to provide a method for manufacturing the semiconductor device.

To accomplish the above objects, according to one aspect of the present invention, there is provided a semiconductor device having a high dielectric constant insulating film in a gate section, comprising: a diffusion barrier film for preventing the diffusion of metal elements from the high dielectric constant insulating film to an upper layer, the film being formed on the high dielectric constant insulating film; an insulating film formed on the diffusion barrier film; and a gate electrode formed on the insulating film.

According to another aspect of the present invention, there is provided a manufacturing method of a semiconductor device having a high dielectric constant insulating film in a gate section, comprising the steps of: forming on the high dielectric constant insulating film a diffusion barrier film for preventing the diffusion of metal elements from the high dielectric constant insulating film to an upper layer; forming an insulating film on the diffusion barrier film; and forming a gate electrode on the insulating film.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Preferred embodiments of the present invention will be described in detail below with reference to the accompanying drawings.

Figure 1:
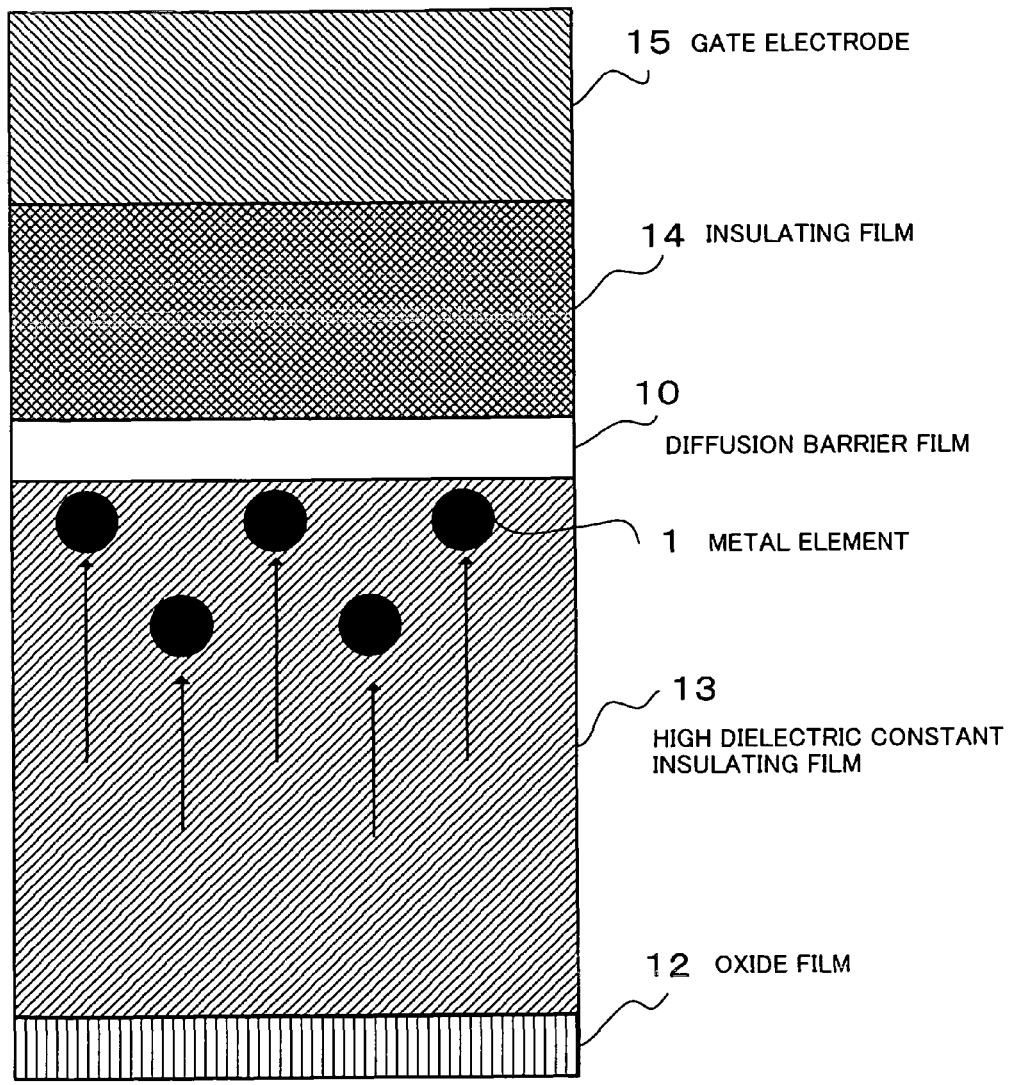
FIG. 1 is a schematic cross sectional view of a MOSFET gate section as a characteristic section of a semiconductor device according to the present embodiment.

FIG. 1 is a schematic cross sectional view of a MOSFET gate section as a characteristic section of a semiconductor device according to the present embodiment. A structure shown in FIG. 1 is as follows. An oxide film 12 and a high dielectric constant insulating film 13 are sequentially formed on a semiconductor substrate (not shown). A diffusion barrier film 10 is formed on the film 13. An insulating film 14 having a Si content larger than that of the film 13 is formed on the film 10. Further, a gate electrode 15 made of polysilicon is formed on the film 14. As examples of materials, the oxide film 12 includes a $SiO_2$ film, the high dielectric constant insulating film 13 includes a $HfO_2$ film, the diffusion barrier film 10 includes a silicon nitride (SiN) film (film thickness: from 0.2 to 0.5 nm), and the insulating film 14 includes a hafnium silicate (HfSiO) film, respectively.

By adopting the above-described structure, the following effects can be expected as compared with a conventional structure.

In the manufacturing process of the MOSFET having the high dielectric constant insulating film 13 in a gate section, a heat treatment is performed after the impurity doping in order to form a source/drain region (not shown). When the heat treatment is performed, a metal element 1 such as Hf in the film 13 is caused to diffuse by heat energy. However, unlike the conventional method, the diffusion of the metal element 1 to the insulating film 14 having a Si content larger than that of the film 13 is suppressed by the diffusion barrier film 10 as well as a reaction between the metal element 1 and the Si element in the gate electrode 15 is suppressed. As a result, the threshold shift can be suppressed, and therefore, operation of the CMOS circuit becomes possible.

A method for manufacturing the semiconductor device according to the present embodiment will be described below.

FIGS. 2 to 9 are schematic cross sectional views in the respective manufacturing steps of the MOSFET.

Hereinafter, a manufacturing method of an n-MOSFET will be described.

Figure 2:
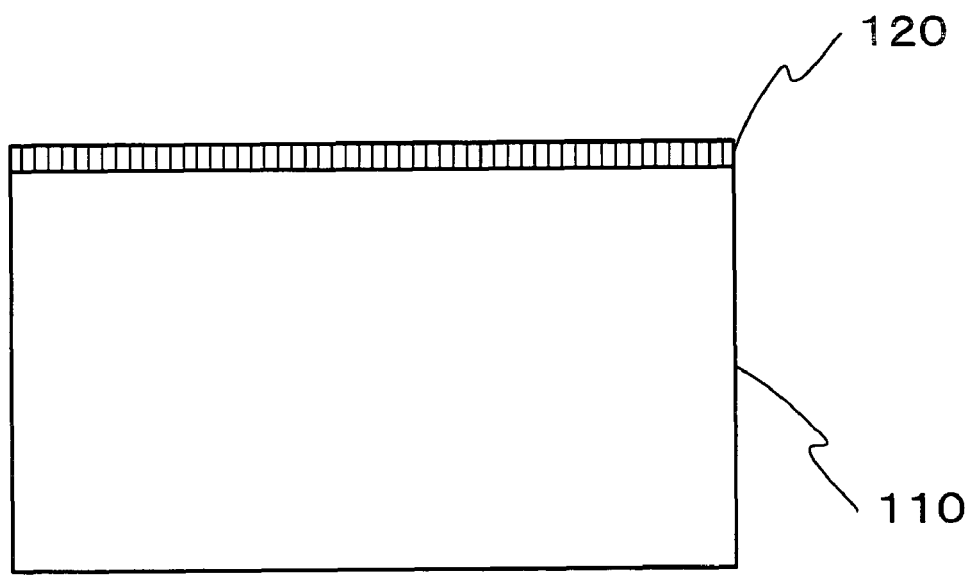
FIG. 2 is a schematic cross sectional view (part 1) in each manufacturing step of a MOSFET.
Figure 3:
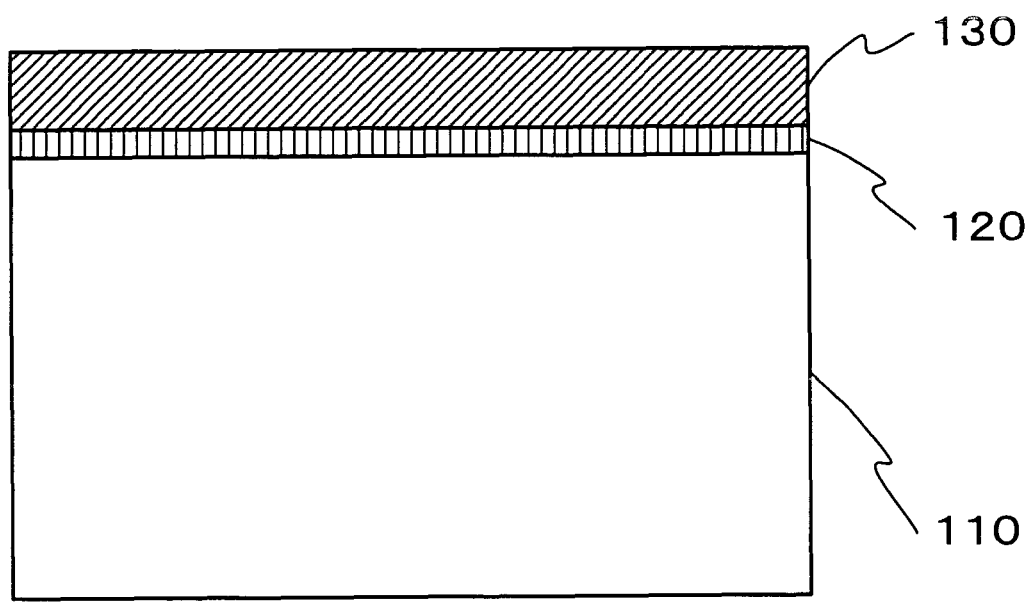
FIG. 3 is a schematic cross sectional view (part 2) in each manufacturing step of a MOSFET.

In order to form a P-type impurity doped region on a Si substrate 110, a boron (B) ion is implanted. Then, the substrate 110 is exposed to a high-temperature oxygen ($O_2$) atmosphere to form thereon a $SiO_2$ film 120 (FIG. 2). After formation of the $SiO_2$ film 120, a $HfO_2$ film 130 is formed (FIG. 3).

Figure 4:
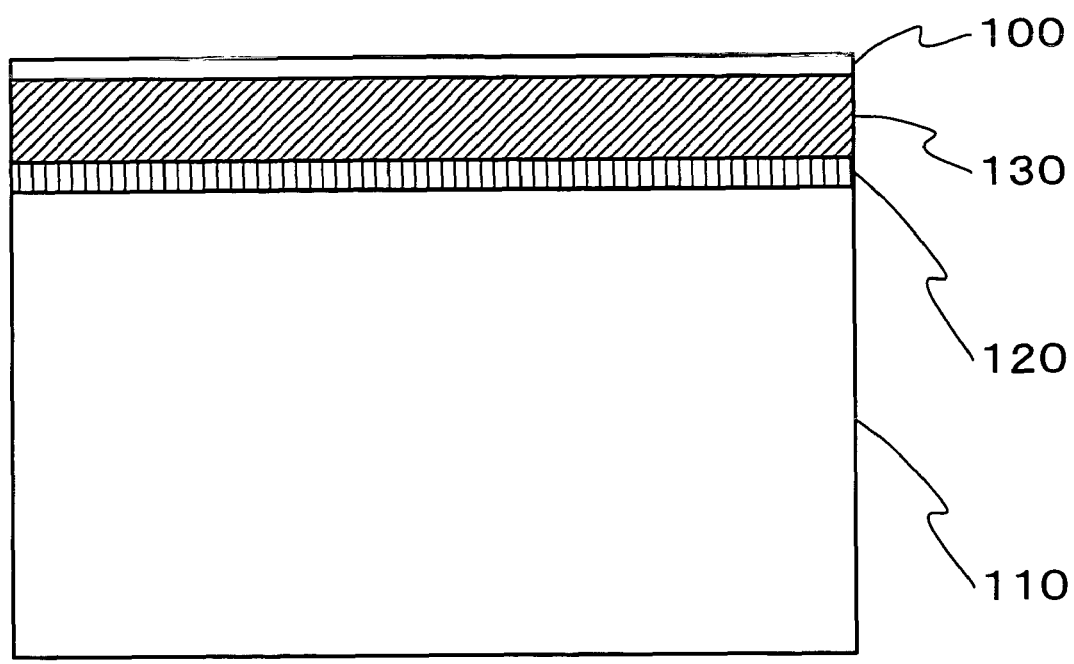
FIG. 4 is a schematic cross sectional view (part 3) in each manufacturing step of a MOSFET.

After formation of the $HfO_2$ film 130, nitriding is performed on a surface of the film 130. Then, a SiN film 100 having a thickness from 0.2 to 0.5 nm is formed by a metal organic chemical vapor deposition (MOCVD) method (FIG. 4).

Figure 5:
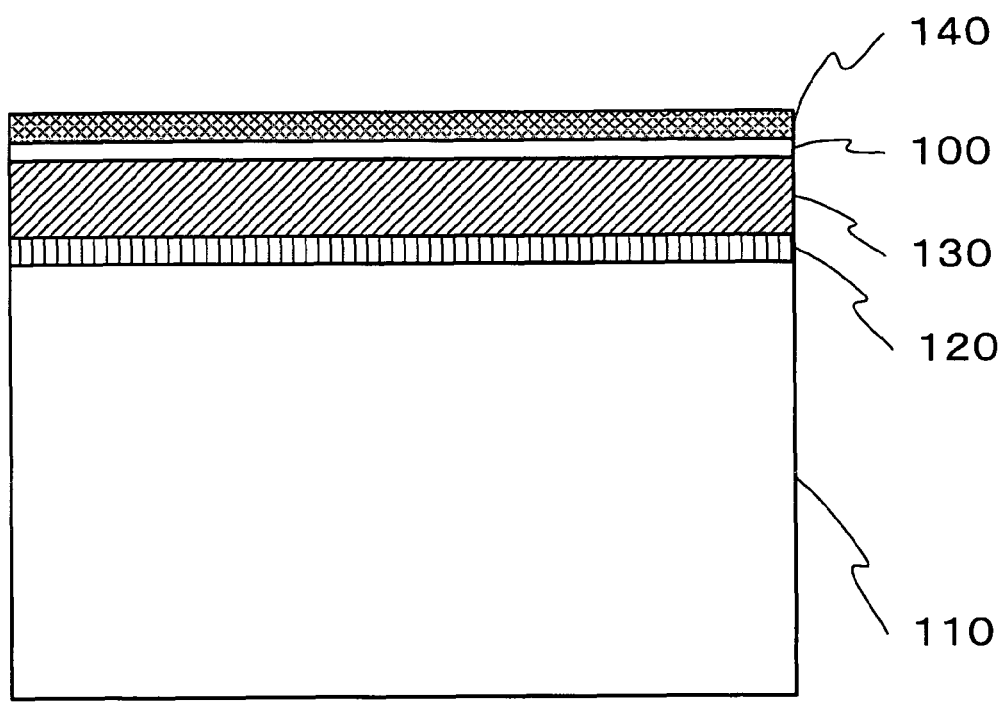
FIG. 5 is a schematic cross sectional view (part 4) in each manufacturing step of a MOSFET.
Figure 6:
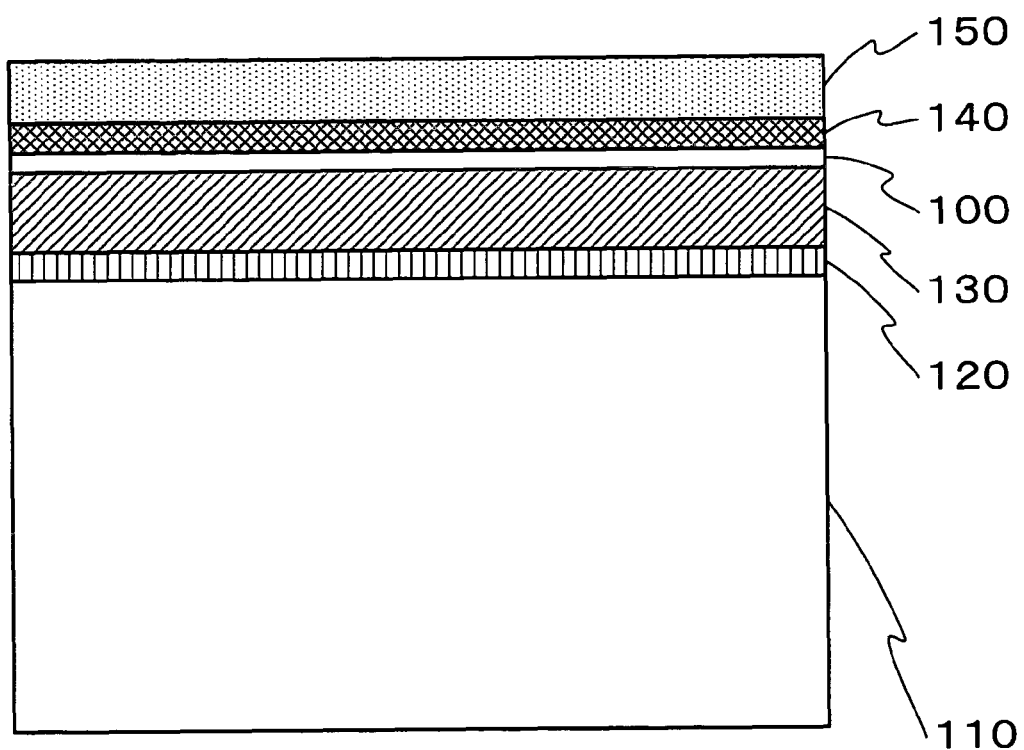
FIG. 6 is a schematic cross sectional view (part 5) in each manufacturing step of a MOSFET.
Figure 7:
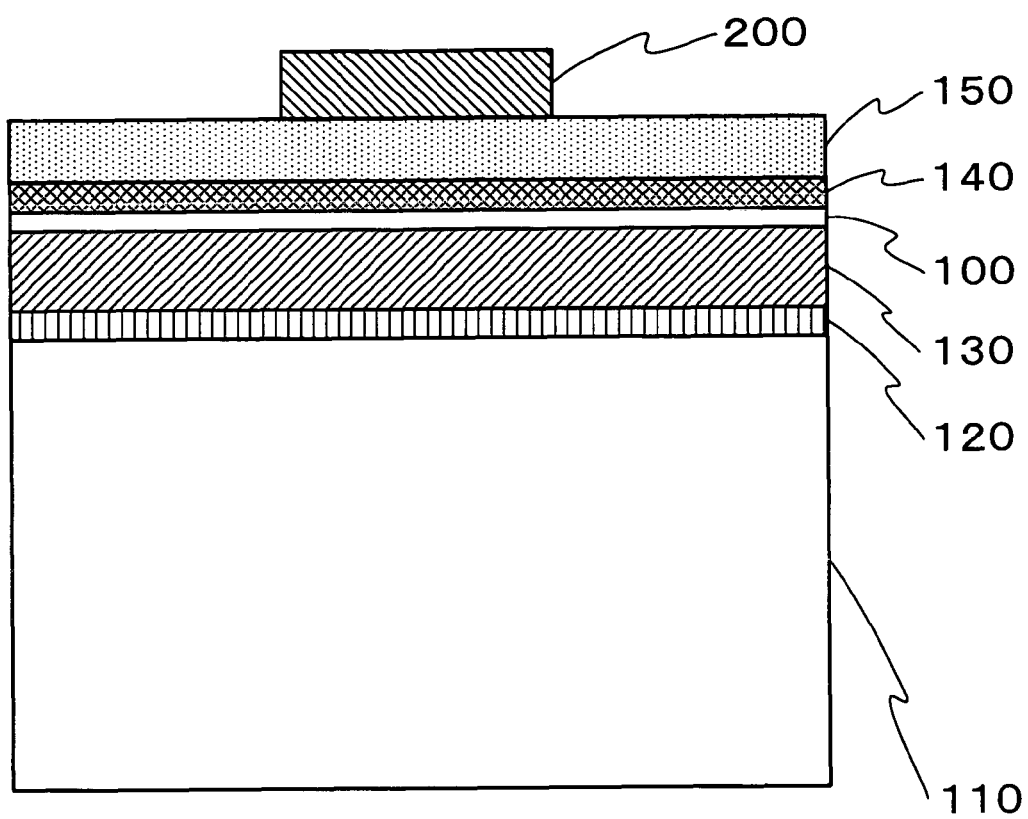
FIG. 7 is a schematic cross sectional view (part 6) in each manufacturing step of a MOSFET.
Figure 8:
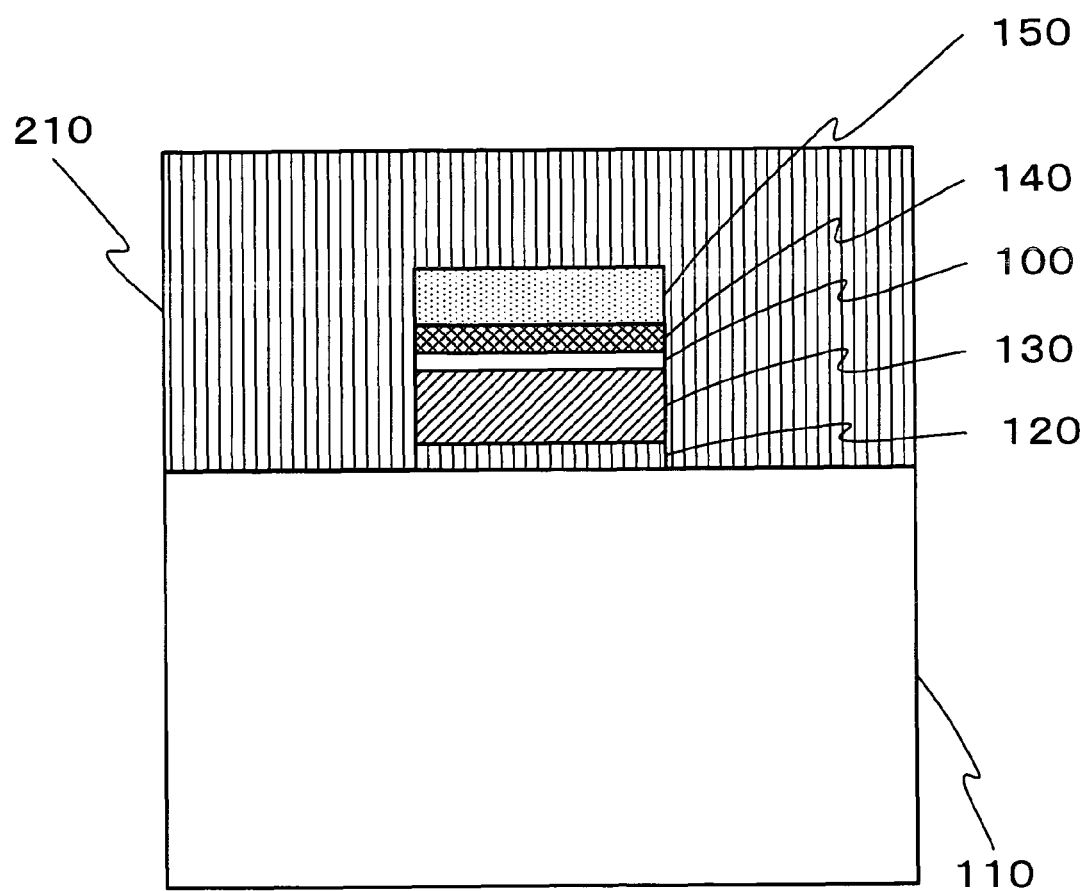
FIG. 8 is a schematic cross sectional view (part 7) in each manufacturing step of a MOSFET.
Figure 9:
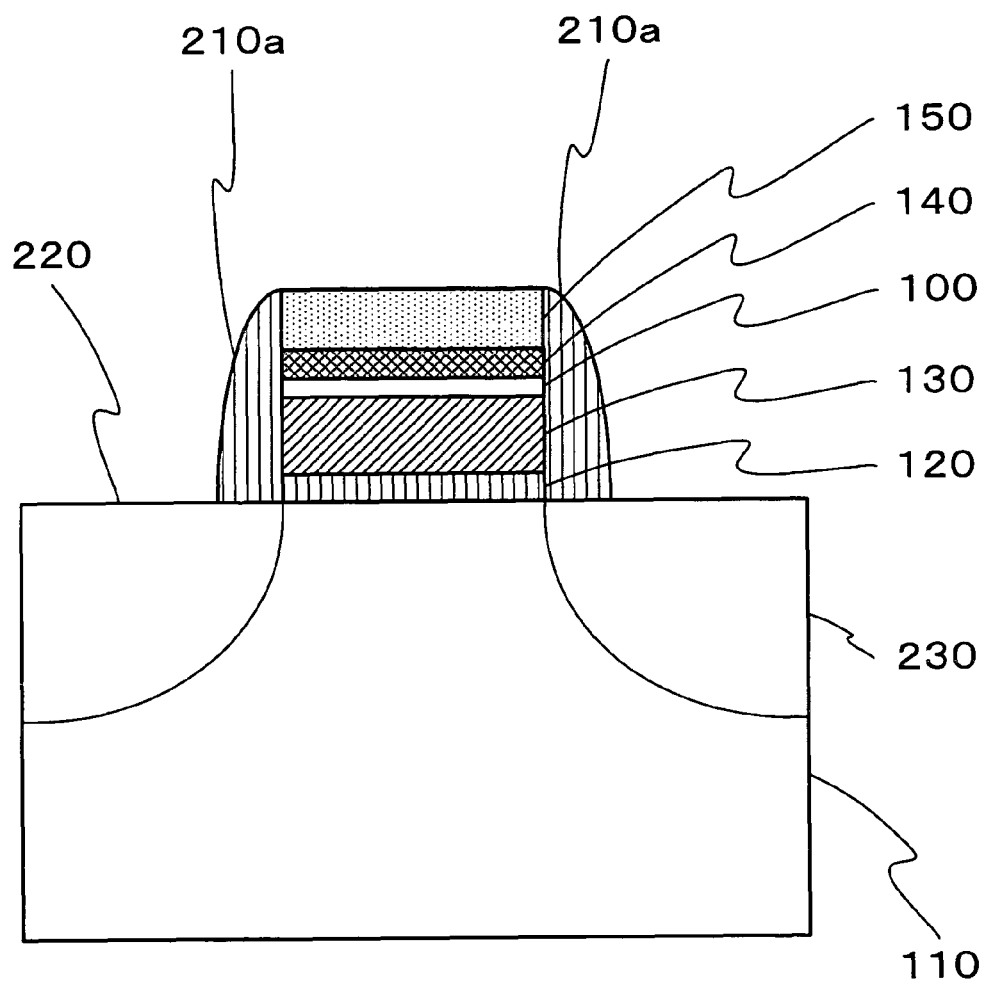
FIG. 9 is a schematic cross sectional view (part 8) in each manufacturing step of a MOSFET.
Figure 10A:
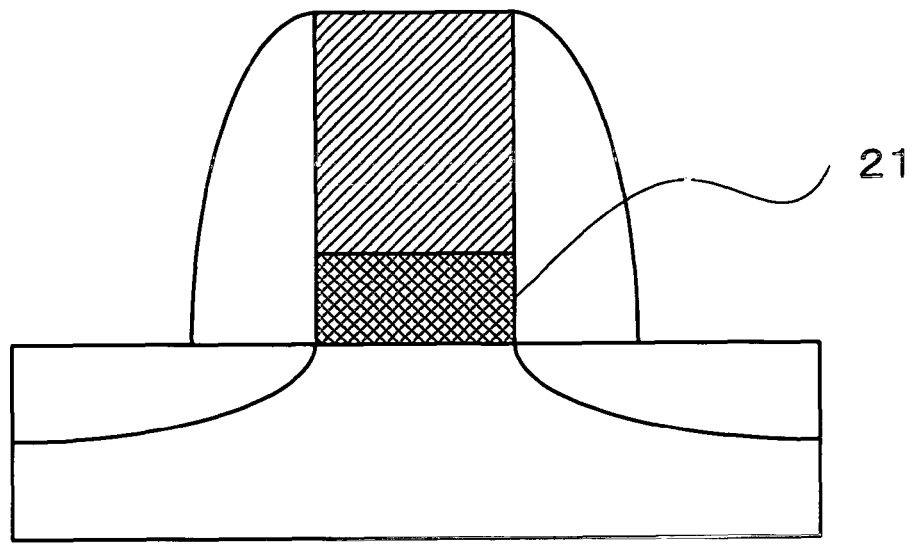
FIGS. 10A and 10B are schematic views of a MOSFET.
Figure 10B:
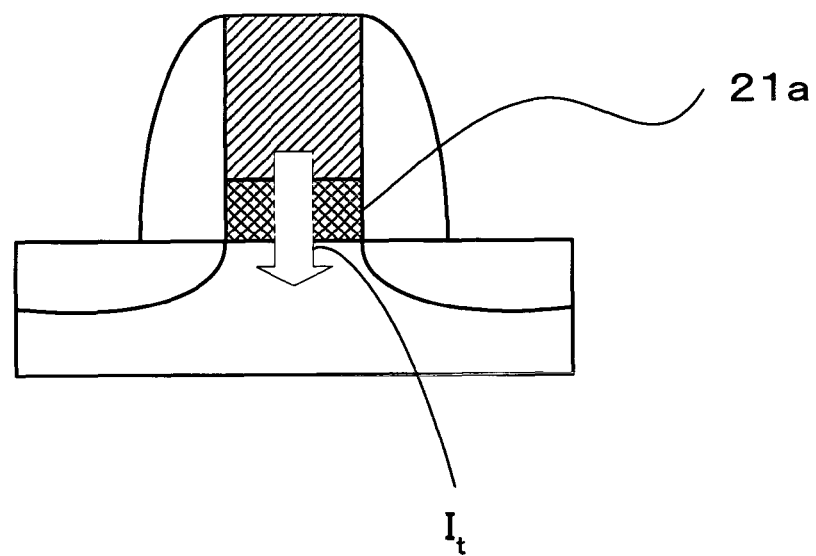
Figure 11:
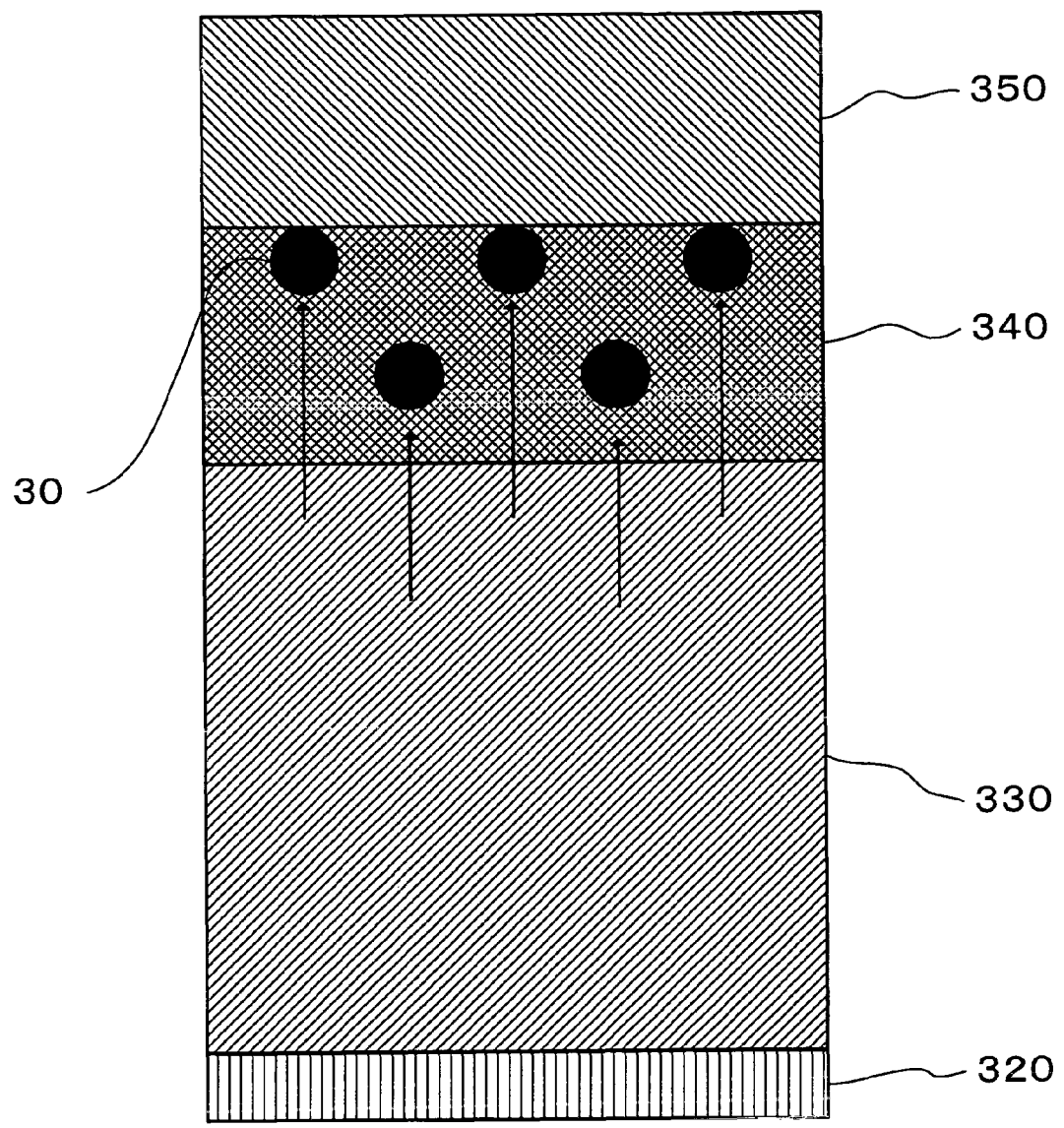
FIG. 11 is a schematic cross sectional view of a gate section.
Figure 12:
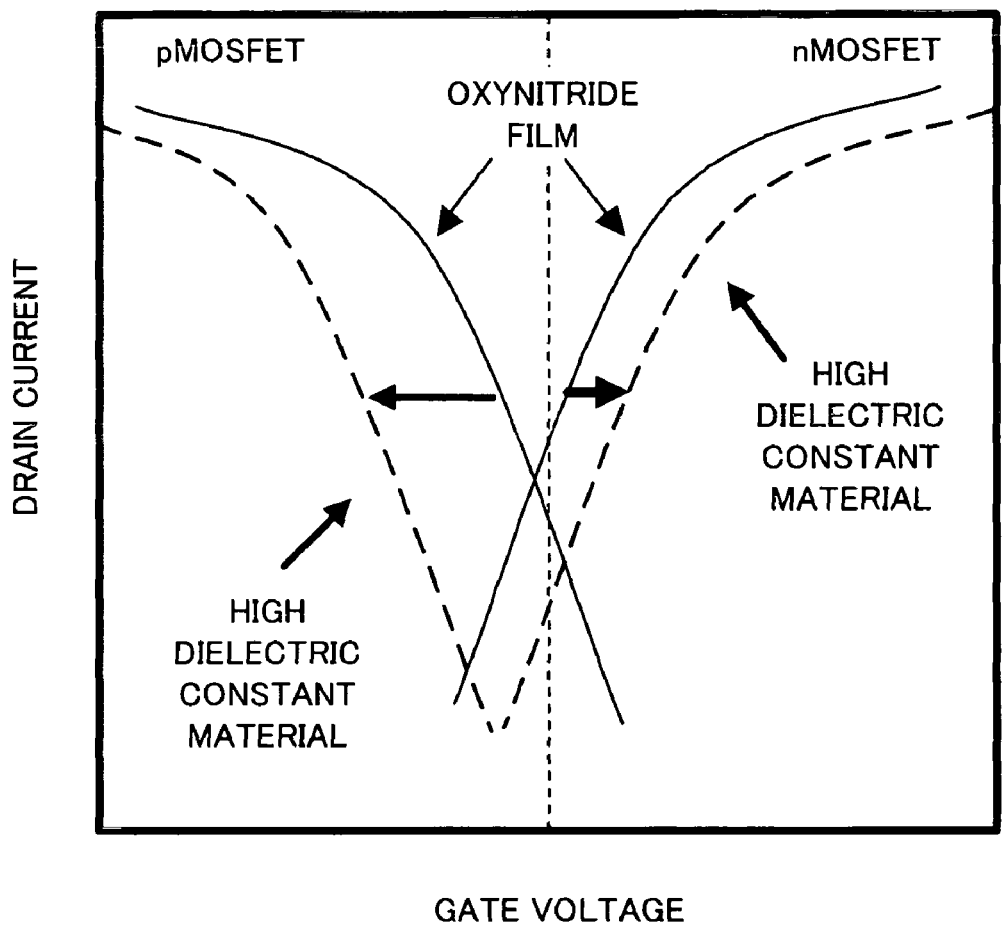
FIG. 12 shows a gate voltage versus drain current characteristics of a MOSFET.

After formation of the SiN film 100, a HfSiO film 140 is formed (FIG. 5). After formation of the HfSiO film 140, a polysilicon film 150 is formed as a gate electrode (FIG. 6). After formation of the polysilicon film 150, a photoresist (not shown) is coated on the film 150. Further, the photoresist is exposed to light and developed to form a photoresist pattern 200 (FIG. 7). Using as a mask the photoresist pattern 200, etching is performed. After removal of the photoresist pattern 200, an oxide film 210 is formed on the whole surface (FIG. 8). Thereafter, sidewalls 210a are formed by Reactive Ion Etching (RIE). Then, a source region 220/drain region 230 is formed by implanting, for example, a phosphorus (P) ion and performing the heat treatment (FIG. 9). Thereafter, a wiring process is performed.

By thus forming the diffusion barrier film on the high dielectric constant material, diffusion of the metal elements in the high dielectric constant material can be suppressed as well as the reaction between the metal elements and the Si element in the gate electrode can be suppressed. As a result, the threshold shift can be suppressed and therefore, operation of the CMOS circuit becomes possible.

In the above-described embodiment, a case of using the Si substrate 110 as a semiconductor substrate is described. Even in a case of using a germanium (Ge) substrate as a semiconductor substrate, the same effect can be obtained.

Likewise, a case of using the $HfO_2$ film 130 as a high dielectric constant insulating film is described. Even in a case of using an oxide film, oxynitride film or nitride film which contains at least one of hafnium, aluminum, zirconium, yttrium, lanthanum and tantalum, the same effect can be obtained.

Likewise, a case of using as a diffusion barrier film the SiN film 100 formed by the MOCVD method is described. Even in a case of using a SiN, aluminum nitride (AlN) or hafnium nitride (HfN) film formed to a thickness from 0.2 to 0.5 nm in consideration of EOT using the MOCVD method or the Atomic Layer Deposition (ALD) method, the same effect can be obtained.

Likewise, a case of using the HfSiO film 140 as an insulating film having a large Si content is described. Even in a case of using an oxide film, oxynitride film or nitride film which contains Si as well as contains at least one of hafnium, aluminum, zirconium, yttrium, lanthanum and tantalum, the same effect can be obtained.

According to the semiconductor device of the present invention, the diffusion barrier film for preventing the diffusion of the metal elements from the high dielectric constant insulating film to the upper layer is formed on the high dielectric constant insulating film. Therefore, the diffusion of the metal elements from the high dielectric constant insulating film to the upper layer can be prevented as well as the reaction and bonding between the metal elements and the element in the gate electrode can be suppressed near a boundary between the insulating film on the diffusion barrier film and the gate electrode. As a result, the threshold shift in the MOSFET can be suppressed.

Further, according to the manufacturing method of the semiconductor device of the present invention, the diffusion barrier film for preventing the diffusion of the metal elements from the high dielectric constant insulating film to the upper layer is formed on the high dielectric constant insulating film and then, the insulating film is formed on the diffusion barrier film. Therefore, the diffusion of the metal elements from the high dielectric constant insulating film to the upper layer can be prevented. As a result, the threshold shift in the MOSFET can be suppressed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
   a semiconductor substrate;
   a first insulating film including oxide, oxynitride or nitride which has at least one metal element of hafnium, aluminum, zirconium, yttrium, lanthanum and tantalum, the first insulating film being formed over the semiconductor substrate;
   a diffusion barrier film to prevent diffusion of the metal element included in the first insulating film, the diffusion barrier film being formed over the first insulating film;
   a second insulating film including oxide, oxynitride or nitride which has silicon and at least one metal element of hafnium, aluminum, zirconium, yttrium, lanthanum and tantalum, and formed over the diffusion barrier film; and
   a gate electrode formed over the second insulating film;
   wherein a silicon content of the second insulating film is larger than a silicon content of the first insulating film, a metal element content of the first insulating film is larger than a metal element content of the second insulating film, and the diffusion barrier film includes aluminum nitride.

2. The semiconductor device according to claim 1, wherein:
   a thickness of the diffusion barrier film is set to 0.2 nm to 0.5 nm.

3. The semiconductor device according to claim 1, wherein:
   an $SiO_2$ film is formed between the first insulating film and the semiconductor substrate.

* * * * *